United States Patent [19]
Landry

[11] Patent Number: 6,119,249
[45] Date of Patent: Sep. 12, 2000

[54] MEMORY DEVICES OPERABLE IN BOTH A NORMAL AND A TEST MODE AND METHODS FOR TESTING SAME

[75] Inventor: Gregory J. Landry, San Jose, Calif.

[73] Assignee: Cypress Semiconductor Corp., San Jose, Calif.

[21] Appl. No.: 09/049,952

[22] Filed: Mar. 27, 1998

[51] Int. Cl.[7] .................................................. G11C 29/00
[52] U.S. Cl. ............................................................ 714/718
[58] Field of Search ................................... 714/718, 719; 365/189.01, 189.04, 189.05, 189.11, 190, 203

[56] References Cited

U.S. PATENT DOCUMENTS

| | | | |
|---|---|---|---|
| 5,383,157 | 1/1995 | Phelan . | |
| 5,557,619 | 9/1996 | Rapoport . | |
| 5,835,446 | 11/1998 | Park | 365/233 |
| 5,875,131 | 2/1999 | Shyu | 365/189.1 |
| 5,959,901 | 9/1999 | Kawahara | 365/189.11 |
| 5,959,911 | 9/1999 | Krause et al. | 365/201 |

OTHER PUBLICATIONS

Inoue et al., *Parallel Testing Technology for VLSI Memories*, Paper No. 45.1, 1987 International Test Conference CH2347–2/87/0000/1066.

Goto et al. *A 3.3–V 12–ns 16–Mb CMOS SRAM*, IEEE Journal of Solid State Circuits vol. 27, No. 11 Nov. 1992. 0018–9200/92.

P.K. Lala and A. Walter, *An on–Chip test scheme for SRAMS*, IEEE International Workshop on Memory Technology Design and Testing, 1994 0–8186–6245–X/94.

DiMarco et al., *A 200 MHz 256kB Second–Level Cache with 1.6 GB/s Data Bandwidth*, 1996 IEEE International Solid State Circuits Conference 0–7803–3136–Feb. 1996.

*Primary Examiner*—Hoa T. Nguyen
*Attorney, Agent, or Firm*—Christopher P. Maiorana, P.C.

[57] ABSTRACT

A method of testing, in parallel, a memory device including a plurality of memory cells organized into memory blocks, the memory device having a plurality of wired-OR pre-charged differential data line pairs, includes the steps of enabling a predetermined number of memory blocks at a time; writing to and reading as many bits as the predetermined number of enabled memory blocks in parallel; and detecting when both data lines of each of the wired-OR differential pairs are active at a same time, indicating that at least one bad memory cell exists within at least one of the predetermined number of enabled memory blocks. According to another embodiment, a memory device operable in both a normal and a test mode includes a plurality of memory cells organized into a plurality of blocks; at least one wired-OR pre-charged differential data line pair connected to each of the blocks; a block address decoder, the block address decoder enabling one of the plurality of blocks at a time during normal operation and more than one block at a time when the memory device is operating in test mode; and an output buffer for each of the at least one wired-OR differential pairs, the output buffer including a bad cell detector, the bad cell detector causing an output of the buffer to tri-state when a status of a differential pair connected to the buffer is indicative of at least one bad memory cell within at least one of the plurality of enabled blocks.

18 Claims, 4 Drawing Sheets

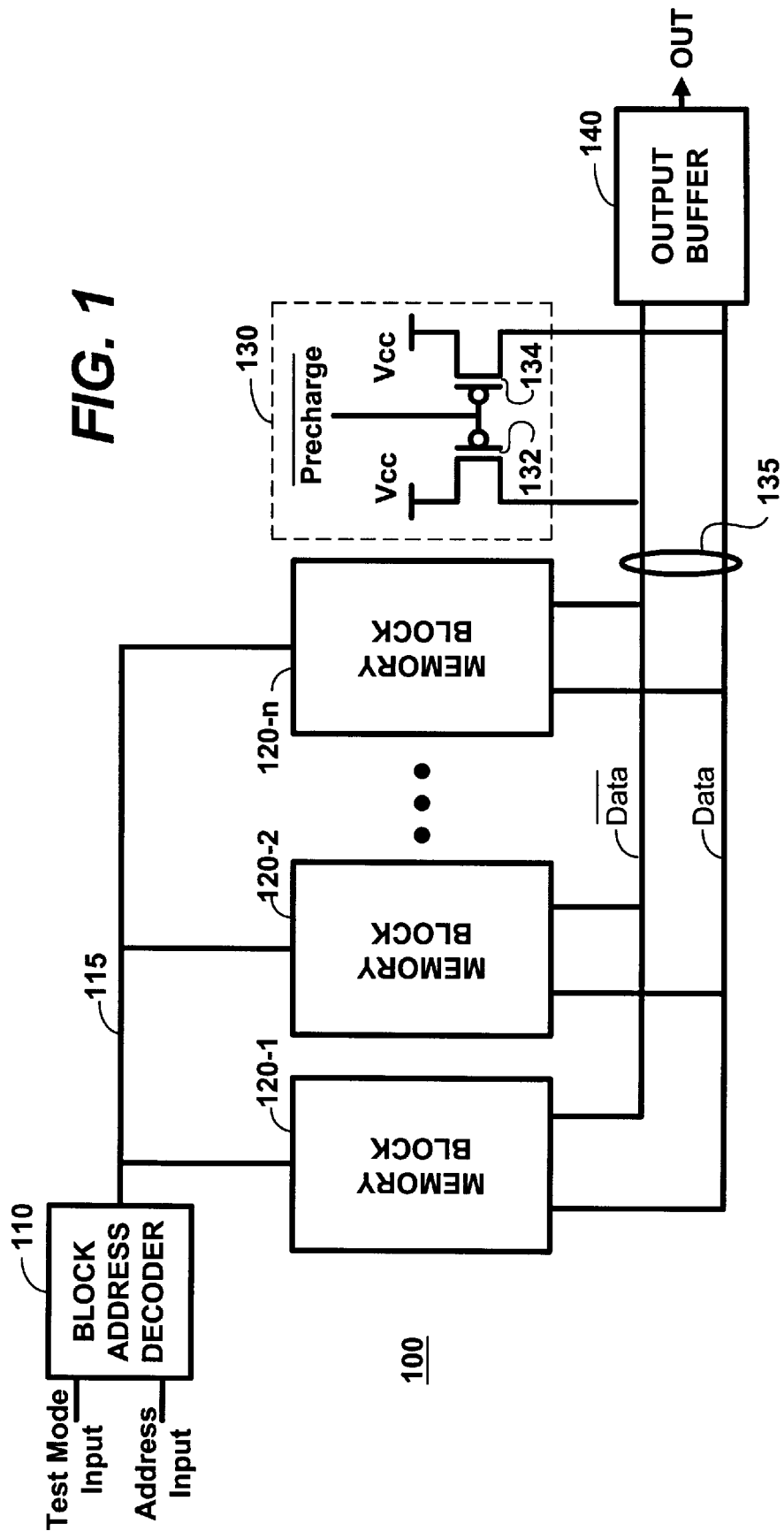

MEMORY DEVICES OPERABLE IN BOTH A NORMAL AND A TEST MODE AND METHODS FOR TESTING SAME

BACKGROUND OF THE INVENTION

1. Field of the Invention

The invention pertains to the semiconductor field. More particularly, the present invention relates to an apparatus and a parallel test mode method for verifying the functionality of memory cells in a memory device.

2. Description of the Related Art

As the density of memory devices increases, so does the time and expense of testing the functionality of each memory cell contained therein. For example, to completely test a 256K×18 memory device, namely a device having about 256,000 memory locations, each location consisting of 18 memory cells, takes about 256,000 cycles. Each such cycle consists of writing a data bit (a 1 or a 0) to each of the 18 memory cells, and insuring that the data bit thereafter read from each of the 18 memory cells is identical to the data bit that was written thereto.

In an effort to reduce the testing time of such memory devices and the expense associated therewith, memory devices have been developed that incorporate parallel test mode circuitry to allow, for example, ×1 and ×4 organizations to be tested as a ×8 organization, or a ×16 organization to be tested as a ×32 organization. The "×n" nomenclature refers to the number of I/O data pins on the device, where n is the number of I/O data pins. Conventional test mode schemes, however, are limited in the number of bits that may be simultaneously tested, and/or require that expected data be provided as an input to the memory device during the read portion of each testing cycle. Moreover, such schemes are typically limited in the number of bits that may be tested during any given cycle to the number of sets of data lines and global sense amplifiers within the device. Alternatively, such schemes may require additional circuits in the data line, such as a multiplexer, to select more than one data line during the test mode of operation. Such additional circuits, however, if not required during the normal operation of the memory device, often detrimentally add to the overall access time of the device.

What is needed, therefore, is an apparatus and a method for carrying out parallel testing of memory devices, in which the number of memory cells that may be simultaneously tested is not limited to the number of sets of data lines in the device. What is also needed is an apparatus for carrying out parallel testing of memory devices in which it is not necessary to provide expected data to the device, or to provide a separate I/O pin for the expected data. What is also needed is an apparatus for parallel testing memory devices that does not rely upon access time degrading circuitry in the data line to carry out the testing procedure.

SUMMARY OF THE INVENTION

It is, therefore, an object of the present invention to provide an apparatus and a method for carrying out parallel testing of memory devices, in which the number of memory cells that may be simultaneously tested is not limited to the number of sets of data lines in the device. It is a further object of the present invention to provide an apparatus for carrying out parallel testing of memory devices in which it is not necessary to provide expected data to the device, or to provide a separate I/O pin for the expected data. It is a further object of the present invention to provide an apparatus for parallel testing memory devices that does not rely upon access time degrading circuitry in the data line to carry out the testing procedure.

In accordance with the above objects and those that will be mentioned and will become apparent below, a method of testing a memory device including a plurality of blocks of memory cells and pre-charged wired-OR differential pairs, according to an embodiment of the present invention, comprises sequentially and recursively carrying out the steps of:

simultaneously enabling a plurality of memory blocks;

selecting a memory location within each of the enabled memory blocks;

writing predetermined data to said selected memory location within each of said enabled memory blocks;

reading, from said wired-OR differential pairs, said predetermined data from said selected address location from each of said enabled memory blocks in parallel; and tri-stating a particular output of the memory device when both data lines of a wired-OR differential pair associated with the particular output have been pulled to an active state, indicating at least one bad memory cell within at least one of the plurality of enabled blocks.

According to other embodiments, the enabling step may comprise a step of asserting a test mode signal, the assertion of the test mode signal causing the memory device to enter into a test mode and enabling an address decoder of the device to select and enable the plurality of memory blocks. The tri-stating step may further comprise steps of comparing both data lines of each of the differential pairs to determine whether both data lines have been pulled to an active state, and storing a predetermined logic level in a pair of latch circuits associated with the particular output so as to cause the particular output to tri-state. The storing step may further comprise steps of disabling a set path of each latch circuit of the pair of latch circuits; and enabling a reset path of each latch circuit of the pair of latch circuits. The disabling step may comprise creating a substantially open circuit between each of the latch circuits and a reference voltage source, and the enabling step may comprise creating a substantially closed circuit between each of the latch circuits and the reference voltage source.

According to another embodiment of the present invention, a memory device operable in both a normal and a test mode comprises:

a plurality of memory cells organized into a plurality of blocks;

at least one wired-OR pre-charged differential pair connected to each of the blocks;

a block address decoder, the block address decoder enabling one of the plurality of blocks at a time during normal operation and more than one block at a time when the memory device is operating in test mode; and an output buffer for each of the at least one wired-OR differential pairs, the output buffer including a bad cell detector, the bad cell detector causing an output of the buffer to tri-state when a status of a differential pair connected to the buffer is indicative of at least one bad memory cell within at least one of the plurality of enabled blocks.

According to still further embodiments, the block address decoder may include a multiple block enabling circuit for enabling more than one block at a time responsive to a test mode signal and block address signals. Each output buffer may further comprise a first and a second latch circuit; a first and a second set circuit to set the first and second latch circuits, respectively, the first and second set circuits each being prevented from setting the first and second latch circuits when the bad cell detector detects at least one bad memory cell; a first and a second reset circuit to reset the first and second latch circuits, respectively, the first and second reset circuits resetting both the first and second latch circuits, respectively, when the bad cell detector detects at least one bad memory cell; and an output circuit driven by the first and second latch circuits. Each of the first and second reset circuits may be controlled by one of the data lines of the differential pair connected to the buffer to reset the first and the second latch circuits, respectively. In this manner, the output of the buffer is tri-stated when both data lines of the differential pair connected to the buffer are simultaneously in an active state. Each of the first and second set circuits may comprise a pair of series-connected switching circuits, one switching circuit of each pair being controlled by the bad cell detector to prevent the setting of its respective latch circuit upon detection of at least one bad memory cell. Either or both of the first and second latch circuits may comprise cross-coupled inverter circuits. The output circuit may be configured to receive a latch output signal from each of said first and second latch circuits and to selectively output one of a first logic level, a second logic level and a tri-stated output signal when the bad cell detector detects at least one bad memory cell. The bad cell detector may comprise a logic circuit having an input connected to each of the data lines of the differential pair connected to the buffer. The logic circuit outputs a bad bit signal to the first and second set circuits only when each of the data lines are simultaneously in an active state.

According to another illustrative embodiment of the present invention, a method of testing, in parallel, a memory device including a plurality of memory cells organized into memory blocks, the memory blocks having a plurality of wired-OR pre-charged differential pairs, comprises the steps of:

enabling a predetermined number of memory blocks at a time;

writing to predetermined memory cells within each of the predetermined number of enabled memory blocks;

reading, in parallel as many bits from each of the wired-OR differential pairs as the predetermined number of enabled memory blocks; and detecting when both data lines of each of the plurality of wired-OR differential pairs are active at a same time. In this manner, when both data lines of a given differential pair are active at the same time, it is known that at least one bad memory cell exists within at least one of the predetermined number of enabled memory blocks.

According to other embodiments, a test mode signal is asserted prior to the enabling step, the test mode signal causing a block address decoder to simultaneously select the predetermined number of memory blocks. The detecting step may further include a step of tri-stating an output of an output buffer connected to the given differential pair. The enabling step may further include selecting memory blocks that are physically non-contiguous on the memory device. The reading step may be carried out by simultaneously reading as many bits from each I/O pin of the device as the predetermined number of enabled memory blocks.

BRIEF DESCRIPTION OF THE DRAWINGS

For a further understanding of the objects and advantages of the present invention reference should be made to the following detailed description, taken in conjunction with the accompanying figures, in which:

FIG. 1 shows a block diagram of an embodiment of the apparatus according to the present invention.

DESCRIPTION OF THE PREFERRED EMBODIMENTS

Figure 2A:
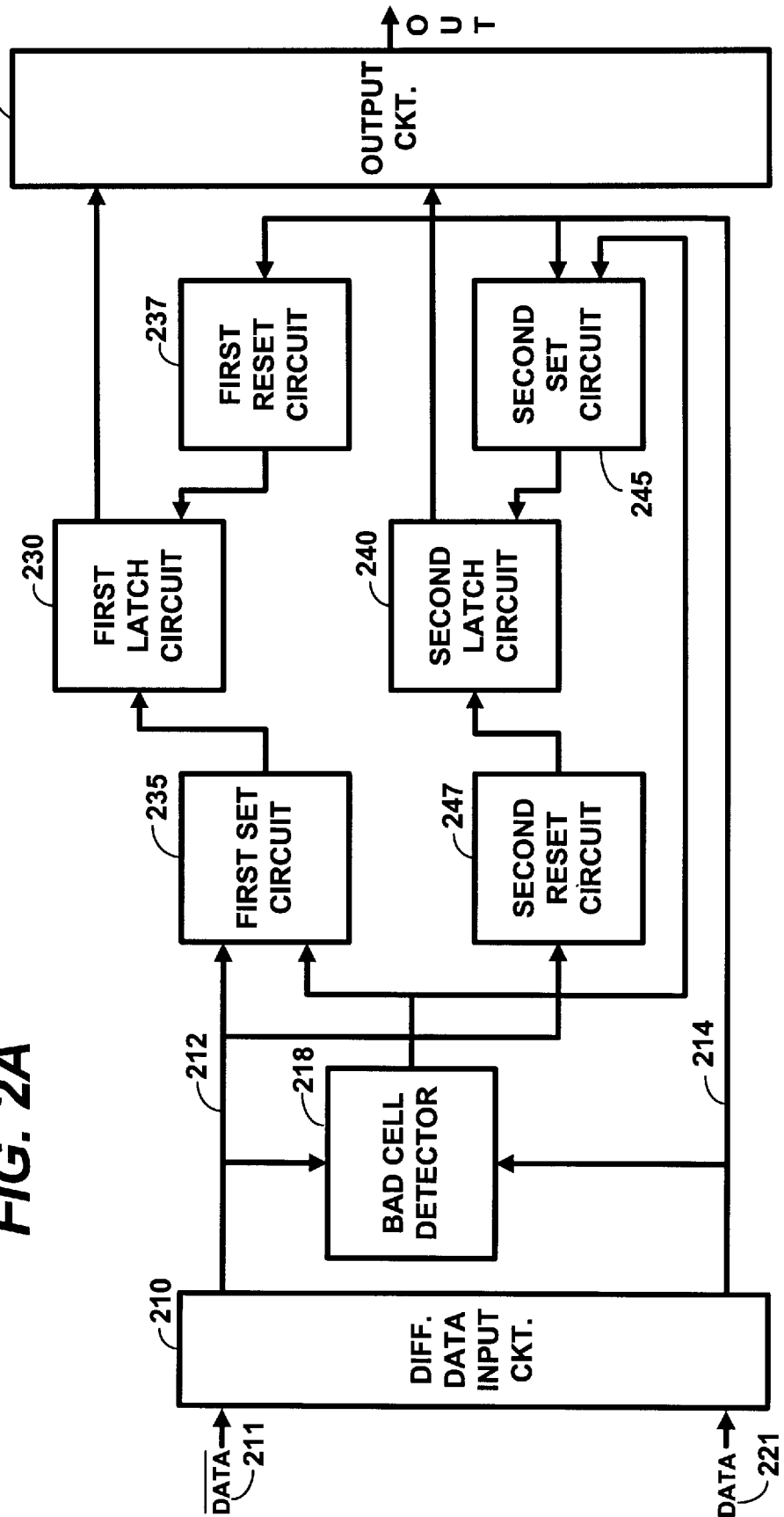
FIG. 2A shows a block diagram of the output buffer 140 of FIG. 1.

FIG. 1 shows a block diagram of an embodiment of the present invention. A memory device incorporating an embodiment of the present invention is shown at reference numeral 100. A plurality of n memory blocks 120-1, 120-2 . . . 120-n are shown, each memory block comprising an array of memory locations, amplifiers and associated logic. Each memory location includes at least one memory cell. Each memory block 120-1, 120-2 . . . 120-n occupies a specific address space and has a particular block starting address.

The block address decoder 110, during normal operation of the memory device 100, selects and enables one of the n memory blocks 120-1, 120-2 . . . 120-n via address lines 115, according to the block address input therein. According to the present invention, the block address decoder 110 also includes a test mode input adapted to receive a test mode signal. When asserted, the test mode signal enables the test mode according to the present invention, causing the block address decoder 110 to select and enable more than one of the memory blocks 120-1, 120-2 . . . 120-n at a time. According to the present invention, as few as two memory blocks and as many memory blocks as exist in the memory device 100 may be selected by the block address decoder 110 during the test mode of operation, depending on the current handling capacity of the differential pairs 135 and the heat dissipating capacity of the memory device itself. Therefore, according to the present invention, there is no theoretical limit as to the number of memory cells of a given memory device that may be tested simultaneously. Indeed, all of the device's memory cells could be tested in parallel in a single cycle, power considerations permitting.

Once enabled, a memory block 120-1, 120-2 . . . 120-n drives its output onto each of its associated wired-OR differential pairs 135. Each wired-OR differential pair 135 includes two data lines, labeled in FIG. 1 as DATA and $\overline{\text{DATA}}$. For clarity, only one such wired-OR differential pair 135 is shown. However, it is to be understood that one such wired-OR differential pair is present for each of the n bits of a ×n device. For example, for a ×18 memory device, 18 such wired-OR differential pairs are present. During normal operation or during test mode of the memory device when all memory cells pass the testing, a driver or drivers within each of the memory blocks 120-1, 120-2 . . . 120-n pulls only one of the two data lines DATA and $\overline{\text{DATA}}$ low at a time, to indicate either a logical 1 or a logical 0. For example, data line DATA may be pulled low to indicate a logical 1, whereas data line $\overline{\text{DATA}}$ may be pulled low to indicate a logical 0, or vice-versa. Because of the wired-OR structure of the differential pairs 135, when more than one memory block 120-1, 120-2 . . . 120-n is enabled, only one of the data lines DATA and $\overline{\text{DATA}}$ will be pulled low at any given time if all accessed memory cells are operating correctly or contain the same data. However, both data lines DATA and $\overline{\text{DATA}}$ will be pulled low if all accessed cells do not contain the same data. The present invention exploits this characteristic of such wired-OR differential structures to its advantage.

The wired-OR differential pairs 135 of the memory blocks 120-1, 120-2 . . . 120-n, according to the present invention, are pre-charged before each access. As shown in FIG. 1, a pre-charge circuit, such as pre-charge circuit 130, pulls each of the data lines DATA and $\overline{\text{DATA}}$ to a high level before each memory access. In this manner, the driver or drivers (not shown) of each of the memory blocks 120-1, 120-2 . . . 120-n need only pull one of the data lines DATA and $\overline{\text{DATA}}$ low and need not maintain the other data line at a high level. Both data lines DATA and $\overline{\text{DATA}}$, therefore, start out in the same pre-charged state. As shown in FIG. 1, the pre-charge circuit 130 may include two switching devices 132 and 134 whose control electrodes are connected to one another and to a $\overline{\text{Precharge}}$ signal. When the $\overline{\text{Precharge}}$ signal is pulled low, switching devices 132 and 134 conduct, and pre-charge both data lines of the wired-OR differential pair 135 to approximately Vcc. Switching devices 132 and 134, for example, may be p-channel metal oxide semiconductor (PMOS) transistors.

Figure 3:
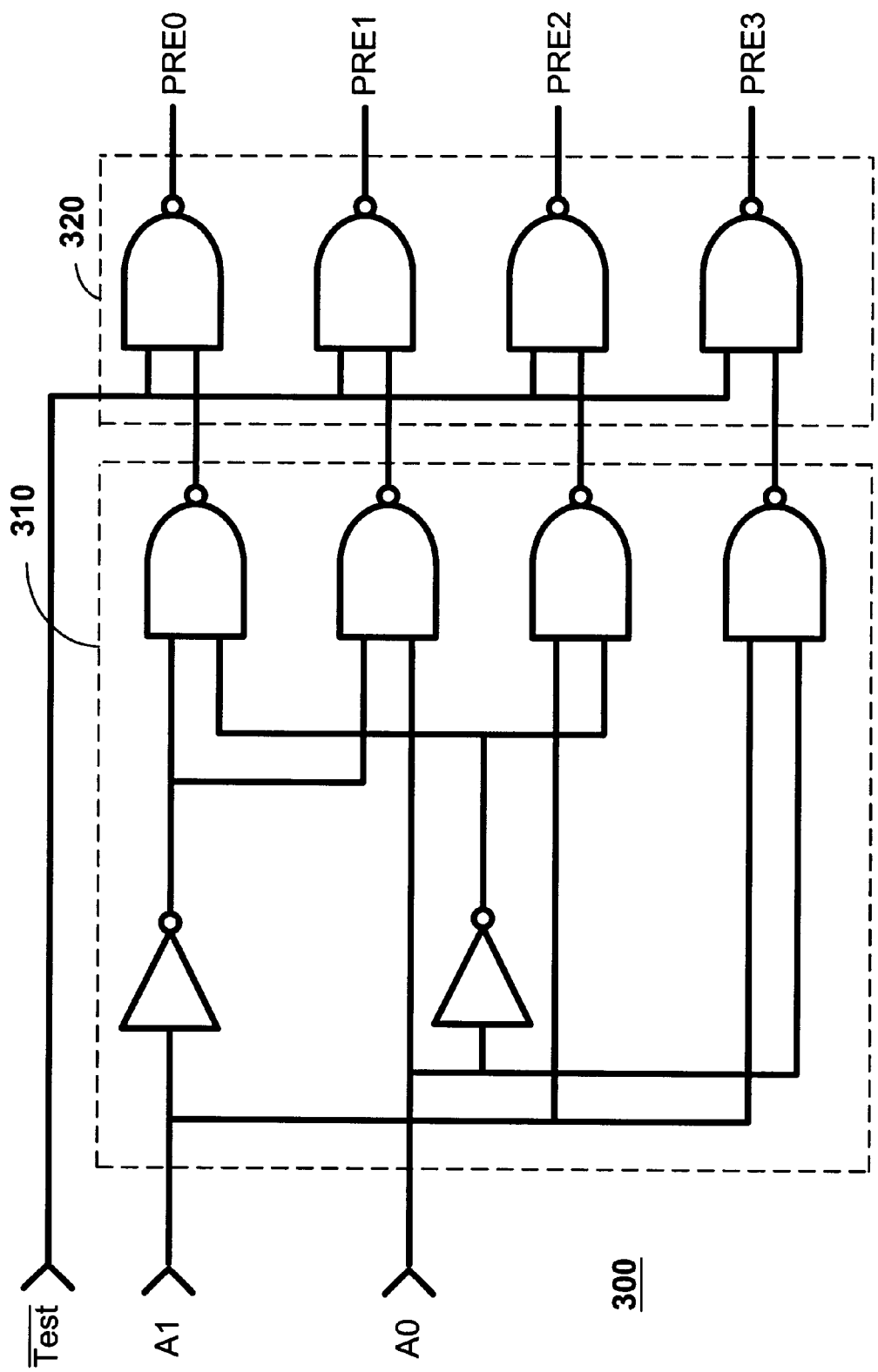
FIG. 3 shows one embodiment of the block address decoder 110 of FIG. 1.

An illustrative embodiment of the block address decoder 110 of FIG. 1 is shown in FIG. 3 at 300. The decoder 300, during normal (e.g., non-test mode) operation, selects and enables a single memory block for access among memory blocks 120-1, 120-2 . . . 120-n by asserting one of the outputs PRE0, PRE1, PRE2 or PRE3. This selection is based upon address inputs A0 and A1. During test mode operation, however, the block address decoder 300 simultaneously selects more than one of the memory blocks 120-1, 120-2 . . . 120-n by asserting all of the outputs PRE0, PRE1, PRE2 or PRE3. For illustrative purposes only, the block address decoder 300 of FIG. 3, when the $\overline{\text{Test}}$ input signal is asserted, simultaneously enables four memory blocks among the memory blocks 120-1, 120-2 . . . 120-n of FIG. 1 by asserting all outputs PRE0, PRE1, PRE2 and PRE3 simultaneously.

Table 1 summarizes the operation of the embodiment of the memory block decoder shown in FIG. 3.

TABLE 1

| Test | A1 | A0 | PRE0 | PRE1 | PRE2 | PRE3 |
|---|---|---|---|---|---|---|
| 1 | 0 | 0 | 1 | 0 | 0 | 0 |
| 1 | 0 | 1 | 0 | 1 | 0 | 0 |
| 1 | 1 | 0 | 0 | 0 | 1 | 0 |
| 1 | 1 | 1 | 0 | 0 | 0 | 1 |
| 0 | 0 | 0 | 1 | 1 | 1 | 1 |
| 0 | 0 | 1 | 1 | 1 | 1 | 1 |
| 0 | 1 | 0 | 1 | 1 | 1 | 1 |
| 0 | 1 | 1 | 1 | 1 | 1 | 1 |

Therefore, the $\overline{\text{Test}}$ input, when asserted, causes the memory block decoder 300 to simultaneously select four memory blocks from among the memory blocks 120-1, 120-2 . . . 120-n. The 1 to 4 decoder 310, when $\overline{\text{Test}}$ input is not asserted, selects the desired memory block from among the memory blocks 120-1, 120-2 . . . 120-n, unaffected by the multiple block enabling circuit 320. The multiple block enabling circuit 320, on the other hand, causes multiple blocks to be enabled simultaneously when its $\overline{\text{Test}}$ input is asserted. A different number of memory blocks may be enabled by the block address decoder 110, by suitably modifying the block address decoder 300 of FIG. 3 to select the desired number of memory blocks, or by implementing a different decoder architecture, such as a multi-level decoding or register-based decoding scheme.

Returning now to FIG. 1, each of the differential pairs 135 are connected to an output buffer, such as output buffer 140.

Each output buffer 140 receives the data lines DATA and $\overline{\text{DATA}}$ and outputs a buffer output signal OUT. The OUT signal may be a tri-stated signal when both the data lines DATA and $\overline{\text{DATA}}$ are active, or may assume a logical 1 or logical 0 state, depending upon which of the data lines DATA and $\overline{\text{DATA}}$ is currently asserted. How this is done is described with reference to FIGS. 2A and 2B.

FIG. 2A depicts, at reference numeral 200, an embodiment of an output buffer according to the present invention. A differential data input circuit 210 receives the data line signals DATA and $\overline{\text{DATA}}$ 221 and 211, respectively, of the wired-OR differential pair 135, shown in FIG. 1. The differential data input circuit 210 takes the DATA and $\overline{\text{DATA}}$ signals 221 and 211, conditions them and outputs conditioned data line signals 212 and 214, respectively. The conditioned data line signals 212 and 214 are then input to the bad cell detector 218. The conditioned data line signal 212 is also input to the first set circuit 235 and to the second reset circuit 247. The conditioned data line signal 214 is also input to the second set circuit 245 and to the reset circuit 237. The output of the bad cell detector 218 is also input to the first set circuit 235, as well as to the second set circuit 245. The first set circuit 235 sets the first latch circuit 230, while the first reset circuit 237 resets it. Likewise, the second set circuit 245 sets the second latch circuit 240 while the second reset circuit 247 resets it. The outputs of the first and second latch circuits 230, 240 are then sent to the output circuit 250. The output circuit 250 then outputs an output signal OUT. The output signal OUT, as discussed relative to FIG. 1, may be a logical 1 or a logical 0, depending upon which of the DATA and $\overline{\text{DATA}}$ data line signals 221 and 211 is active. If both DATA and $\overline{\text{DATA}}$ data line signals 221 and 211 are active, the output circuit 250 will output a tri-stated OUT signal, signifying at least one bad cell among those just accessed and tested.

During normal operation, the bad cell detector 218 does not substantially affect the operation of the output buffer 200. Indeed, when the differential pair 135 (from FIG. 1) is pre-charged, or when one of the DATA and $\overline{\text{DATA}}$ signals 221 and 211 is active, the output of the bad cell detector 218 does not affect the operation of the first set circuit 235 or the second set circuit 245. When, however, both of the DATA and $\overline{\text{DATA}}$ signals 221, 211 are active, the output of the bad cell detector 218 prevents the first and second set circuits 235, 245 from setting the first and second latches 230, 240, respectively. During normal operation, or when all memory cells pass testing, only one of the DATA and $\overline{\text{DATA}}$ data line signal 221 and 211 is active. If the $\overline{\text{DATA}}$ data line signal 211 is active, the first set circuit 235 will set the first latch circuit 230, whereas the second reset circuit 247 will reset the second latch circuit 240. Setting the first latch circuit 230 causes an output signal OUT of a first logical level to be generated from the output circuit 250. Conversely, if the DATA signal 221 is asserted, the second latch circuit 240 will be set by the second set circuit 245, and the output circuit 250 will generate a signal OUT of a second logical level. An assertion of the DATA signal 221, as shown in FIG. 2A, also causes the first reset circuit 237 to reset the first latch circuit 230.

Figure 2B:
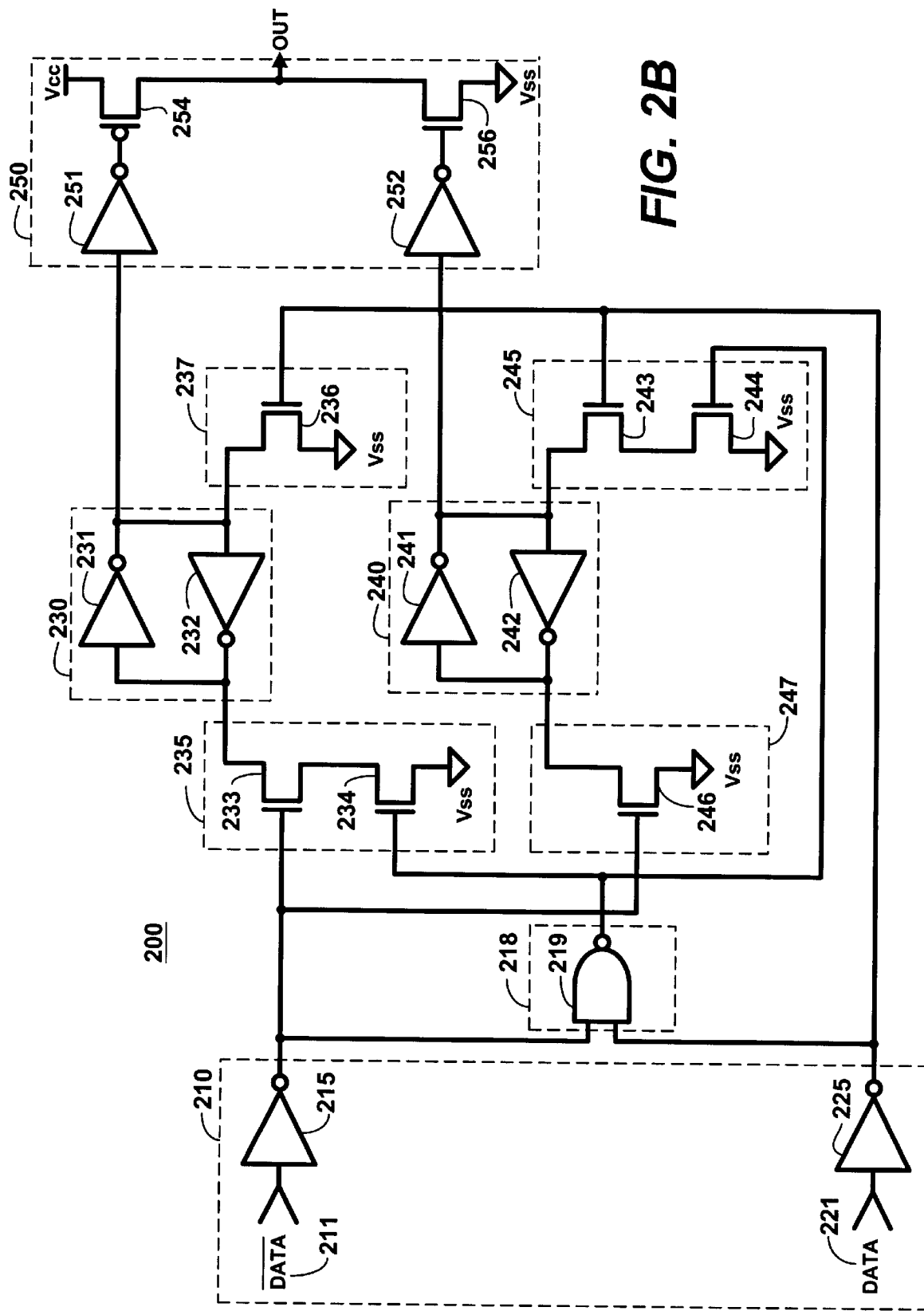
FIG. 2B shows a circuit level embodiment of the block diagram of FIG. 2A.

FIG. 2B is a circuit level implementation of the output buffer 200 shown in FIG. 2A. FIG. 2B, it is to be understood, is but one possible implementation of such an input buffer, and the present invention is not to the specific circuitry shown therein. For clarity, the reference numerals of the functional blocks (shown in dashed lines) correspond to those shown in FIG. 2A.

The differential data input circuit 210 receives the $\overline{\text{DATA}}$ and DATA signals 211, 221 and inverts them in inverters 215 and 225, respectively. The inverted $\overline{\text{DATA}}$ data line signal 211 is then input to the first set circuit 235. Specifically, the inverted $\overline{\text{DATA}}$ data line signal 211 controls a switching device 233. For example, the switching device 233 may be a transistor whose drain terminal is connected to the first latch circuit 230 and whose source terminal is connected to another switching device 234 connected in series thereto. For example, the switching device 234 may be a transistor whose drain terminal is connected to the source terminal of transistor 233 and whose source terminal is connected to a second voltage supply source Vss, such as a ground reference potential. The architecture of the second set circuit 245 may be similar to that of the first set circuit 235. Indeed, the second set circuit 245 may include series-connected switching devices 243, 244. Switching device 243 may be a transistor whose drain terminal is connected to the second latch circuit 240 and whose gate terminal is connected to the output of the inverter 225. Switching device 244 may be a transistor whose drain terminal is connected to the source terminal of transistor 243 and whose source terminal is connected to the second voltage supply source Vss.

The bad cell detector circuit 218 receives inputs from the inverted $\overline{\text{DATA}}$ signal 211 and from the inverted DATA signal 221 output from the inverters 215, 225, respectively. As shown in FIG. 2B, the bad cell detector 218 may be implemented as a logic circuit, such as a NAND gate 219. The output of the NAND gate 219 may control the gate terminals of transistors 234 and 244. Therefore, as long as both $\overline{\text{DATA}}$ and DATA signals 211, 221 are not simultaneously low, the bad cell detector 218 does not interrupt the operation of both the first and second set circuits 235, 245. Indeed, as long as both $\overline{\text{DATA}}$ and DATA signals 211, 221 are not simultaneously active, both switching devices 234 and 244 are maintained in a conductive state, allowing the input of the first latch circuit 230 and the output of the second latch circuit 240 to be pulled to approximately Vss, as appropriate by set circuits 235 and 245, respectively. However, when both $\overline{\text{DATA}}$ and DATA signals 211, 221 are low (in a low, or active state) at the same time, the output of the bad cell detector 218 will also be low. In this case, the output of the bad cell detector 218 prevents the first and second set circuits 235, 245 from setting the first and second latches 230, 240, respectively. In the implementation of the output buffer 200 shown in FIG. 2B, this is done by controlling the conductivity of the switching devices 234 and 244. Indeed, when both the $\overline{\text{DATA}}$ and DATA signals 211, 221 are simultaneously active, transistors 234 and 244 are turned OFF, thus preventing the first and second set circuits 235, 245 from setting the input of the first latch circuit 230 and the output of the second latch circuit 240 to approximately Vss.

As shown in FIG. 2B, the first reset circuit 237 is controlled by the inverted DATA signal 221. The first reset circuit 237 may include a switching element 236, such as a transistor whose gate is controlled by the output of inverter 225, whose drain is connected to the output of the first latch circuit 230 and whose source is connected to the second voltage supply source Vss. Similarly, the second reset circuit 247 is controlled by the inverted $\overline{\text{DATA}}$ data line signal 211. The second reset circuit 247 may include a switching element 246, such as a transistor whose gate is controlled by the output of inverter 215, whose drain is connected to the input of the second latch circuit 240 an whose source is connected to the second voltage supply source Vss.

The first and second latch circuits 230, 240 may be implemented as cross-connected inverters. The first latch circuit 230 may include an inverter 231 and an inverter 232, each having an input and an output. In the first latch circuit 230, the output of inverter 231 is connected to the input of inverter 232, and the output of inverter 232 is connected to the input of inverter 231. Likewise, the second latch circuit 240 may include an inverter 241 and an inverter 242, each having an input and an output. The output of inverter 241 is connected to the input of inverter 242, and the output of inverter 242 is connected to the input of inverter 241. The present invention is not, however, to be limited to the implementations of the latch circuits 230, 240 shown in FIG. 2B. Indeed, those of skill in this art will recognize that the cross-connected inverters are but one of many possible configurations for the first and second latch circuits 230, 240 and all such configurations are deemed to fall within the scope of the present invention. For example, the first and second latch circuits 230, 240 may alternatively include flip-flops, or may be implemented with NAND or NOR logic.

The outputs of the first and second latch circuits 230, 240 are connected to the data output circuit 250. The data output circuit 250 may include inverters 251 and 252. The inputs to the inverters 251 and 252 may be connected, respectively, to the outputs of the first and second latch circuits 230 and 240. Indeed, in the illustrated embodiment, the input of the inverter 251 may be connected to the node connecting the output of the inverter 231 with the input of the inverter 232. Likewise, the input of the inverter 252 may be connected to the node connecting the output of the inverter 241 with the input of the inverter 242. The data output circuit 250 may also include a pull-up switching device connected to and controlled by the output of the inverter 251 and a pull-down switching device connected to and controlled by the output of the inverter 252. For example, the pull-up switching device may be a p-channel transistor 254 whose gate terminal is connected to the output of the inverter 251, and the pull-down transistor may be an n-channel transistor 256 whose gate electrode is connected to the output of the inverter 252. The source terminal of p-channel transistor 254 may be connected to a first voltage supply source Vcc, which may be, for example, a 5V or 3.3V supply. The pull-up transistor need not necessarily be a p-channel transistor, as an n-channel device may be used, provided another inverter is placed in series with inverter 251 and connected with the gate of this n-channel device. The source terminal of n-channel transistor 256 may be connected to the second voltage supply source Vss. The drains of the p-channel transistor 254 and n-channel transistor 256 are connected together, and form the node from which the output OUT of the output buffer circuit 200 is taken. The transistors of the output buffer 200 may be metal-oxide semiconductor (MOS) transistors, or most any appropriate technology, as those of skill will recognize.

During normal operation, that is, when both $\overline{\text{DATA}}$ and DATA signals 211, 221 are both high after pre-charging, or when only one of them is active, the output of the bad cell detector 218 is high, and maintains the switching devices 234 and 244 in a conductive state, thereby allowing the first and second set circuits 235, 245 to set the first and second latches 230, 240, respectively. The output buffer 200 then works normally, substantially unaffected by the bad cell detector 218. However, when both $\overline{\text{DATA}}$ and DATA signals 211, 221 are active (low) at the same time, the bad cell detector 218 disables the first and second set circuits 235 and 245 by causing transistors 234 and 244 to assume a non-conductive state. Moreover, as the outputs of inverters 215 and 225 are high, transistors 236 and 246 conduct, causing the first and second reset circuits 237, 247 to reset the first and second latch circuits 230, 240. In this state, the pull-up transistor 254 is turned OFF, as is the pull-down transistor 256, effectively tri-stating the output OUT of the output circuit 250.

According to the present invention, when the output OUT goes into tri-state, the tester knows that at least one bad memory cell exists within one and possibly more than one of the memory blocks 120-1, 120-2 . . . 120-n. However, the tester will not know exactly which memory cell is bad until further tests are carried out. Thereafter, redundant cells may be activated or the memory device may be rejected. However, as most testing cycles are carried out without detecting any bad memory cell, the present invention offers great savings in both testing time and expense.

Indeed, the number of bits that may be simultaneously tested using the parallel test mode method and/or apparatus according to the present invention is limited only by the number of memory blocks 120-1, 120-2 . . . 120-n that may be enabled at a given time, as well as by the number of sense amplifiers per memory block 120-1, 120-2 . . . 120-n. Additionally, power dissipation considerations may further limit the practical number of memory blocks 120-1, 120-2 . . . 120-n that may be tested simultaneously. However, if power dissipation considerations are adequately addressed, the present invention allows the testing of all memory cells within a memory device in a single cycle. Moreover, to mitigate the effects of large currents that may flow when a large number of the memory blocks 120-1, 120-2 . . . 120-n are enabled, the memory blocks to be enabled may be such that they are physically non-contiguous, thereby distributing the large currents over a greater area of the memory device. It may not be possible, however, to chose physically non-contiguous memory blocks 120-1, 120-2 . . . 120-n if all memory blocks of a memory device are enabled at once.

For example, for a 256K×18 memory device, meaning a memory device having about 256,000 memory locations and 18 I/O data pins, 18 sense amplifiers per memory block 120-1, 120-2 . . . 120-n are typically available. Utilizing the parallel test mode method and/or apparatus according to the present invention, provided that the memory device includes pre-charged, wired-OR differential pairs, by enabling 2 memory blocks at a time, the 256K×18 memory device may be tested as though it were a 128K×36 memory device. To enable a greater number of memory blocks, it is only necessary to suitably modify the block address decoder 110 of FIG. 1. For example, by enabling four memory blocks simultaneously, such as with the block address decoder of FIG. 3, such a 256K×18 memory device may be tested, according to the present invention, as though it were a 64K×72 memory device. Effectively, according to the present invention, a memory device that conventionally necessitates about 256,000 cycles to test may be tested in about the quarter of the time and at much reduced expense, running through only about 64,000 cycles. It should be noted that the parallel test mode method according to the present invention is carried out without incurring substantial penalties in terms of access time and without the need to provide either expected data during testing or an I/O pin therefor.

The present invention is applicable to memory devices having pre-charged full differential pairs, and which use a wired-OR scheme for the memory block data lines. This is a common architecture in synchronous and pipelined Static Random Access Memories (SRAMs) and somewhat less common in asynchronous SRAMs. Any memory device, however, that includes the above described characteristics may benefit from the method and/or apparatus according to the present invention. Moreover, the present invention finds its greatest utility in very dense (greater than 64K words) memory devices, the testing time and expense savings increasing along with increasing densities.

While the foregoing detailed description has described preferred embodiments of the present invention, it is to be understood that the above description is illustrative only and not limiting of the disclosed invention. For example, other implementations of the functional blocks shown in FIG. 2A may occur to those of skill in this art. Moreover, other implementations of the memory block decoder, of the bad cell detector or other functional blocks may be devised. Further modifications will occur to those of skill in this art, and all such modifications are deemed to fall within the scope of the present invention. Thus, the present invention is to be limited only by the claims as set forth below.

What is claimed is:

1. Method of testing a memory device including a plurality of blocks of memory cells and pre-charged wired-OR differential data line pairs, each of the differential data line pairs being coupled to a respective buffer that includes an output, the method comprising sequentially and recursively carrying out the steps of:

simultaneously enabling said plurality of memory cell blocks;

selecting a memory location within each of the enabled memory blocks;

writing predetermined data to said selected memory location within each of said enabled memory blocks;

reading, from said wired-OR differential pairs, said predetermined data from said selected address location from each of said enabled memory blocks in parallel; and tri-stating the output of each respective buffer that is coupled to a differential data line pair for which the read predetermined data indicates that both data lines of the pair have been pulled to an active state, the tri-stated output indicating at least one bad memory cell within at least one of the plurality of enabled blocks.

2. The method of claim 1, wherein the enabling step comprises the step of asserting a test mode signal, the assertion of the test mode signal causing the memory device to enter into a test mode and enabling an address decoder of the device to select and enable the plurality of memory blocks.

3. The method of claim 1, wherein the tri-stating step further comprises the steps of:

comparing both data lines of each of the differential pairs to determine whether both data lines have been pulled to an active state, and storing a predetermined logic level in a pair of latch circuits associated with the buffer that is coupled to the differential data line pair for which the read predetermined data indicates that both data lines of the pair have been pulled to an active state.

4. The method of claim 3, wherein each of the latch circuits includes a set path and a reset path and wherein the storing step further comprises the steps of:

disabling the set path of each latch circuit of the pair of latch circuits; and enabling the reset path of each latch circuit of the pair of latch circuits.

5. The method of claim 4, wherein the disabling step comprises creating a substantially open circuit between each of the latch circuits and a reference voltage source, and wherein the enabling step comprises creating a substantially closed circuit between each of the latch circuits and the reference voltage source.

6. A memory device operable in both a normal and a test mode, comprising:

a plurality of memory cells organized into a plurality of blocks;

at least one wired-OR pre-charged differential data line pair connected to each of the blocks;

a block address decoder coupled to the plurality of blocks, the block address decoder enabling one of the plurality of blocks at a time during normal operation and more than one block at a time when the memory device is operating in test mode; and an output buffer for each pair of the at least one wired-OR differential data line pair, the output buffer including a bad cell detector, the bad cell detector causing an output of the buffer to tri-state when a status of a differential pair connected to the buffer is indicative of at least one bad memory cell within at least one of the plurality of enabled blocks.

7. The memory device of claim 6, wherein the block address decoder includes a multiple block enabling circuit for enabling more than one block at a time responsive to a test mode signal and block address signals.

8. The memory device of claim 6, wherein said output buffer further comprises:

a first latch circuit and a second latch circuit;

a first set circuit and a second set circuit to set the first latch circuit and the second latch circuit, respectively, the first set circuit and the second set circuit each being configured to prevent the first latch circuit and the second latch circuit from setting when the bad cell detector detects at least one bad memory cell;

a first reset circuit and a second reset circuit to reset the first latch circuit and the second latch circuit, respectively, the first reset circuit and second reset circuit resetting both the first latch circuit and second latch circuit, respectively, when the bad cell detector detects at least one bad memory cell; and an output circuit driven by the first latch circuit and second latch circuit.

9. The memory device of claim 8, wherein each of the first and second reset circuits are controlled by one of the data lines of the differential data line pair connected to the buffer to reset the first latch circuit and the second latch circuit, respectively, thereby tri-stating the output of the buffer when both data lines of the differential data line pair connected to the buffer are simultaneously in an active state.

10. The memory device of claim 8, wherein each of the first set circuit and the second set circuit comprises a pair of series-connected switching circuits, one switching circuit of each pair of series-connected switching circuits being controlled by the bad cell detector to prevent the setting of its respective latch circuit upon detection of at least one bad memory cell.

11. The memory device of claim 8, wherein at least one of said first and second latch circuits comprises cross-coupled inverter circuits.

12. The memory device of claim 8, wherein the output circuit is configured to receive a latch output signal from each of said first and second latch circuits and to selectively output one of a first logic level, a second logic level and a tri-stated output buffer signal when said bad cell detector detects at least one bad memory cell.

13. The memory device of claim 8, wherein the bad cell detector comprises a logic circuit having an input connected to each of the data lines of the differential data line pair connected to the buffer, the logic circuit outputting a bad bit signal to the first set circuit and the second set circuit only when each of the data lines are simultaneously in an active state.

14. Method of testing, in parallel, a memory device including a plurality of memory cells organized into memory blocks, the memory device having a plurality of wired-OR pre-charged differential data line pairs coupled to the memory blocks, comprising the steps of:

enabling a predetermined number of memory blocks at a time;

writing to predetermined memory cells within each of the predetermined number of enabled memory blocks;

reading, in parallel, as many bits from each of the wired-OR differential pairs as the predetermined number of enabled memory blocks; and detecting a state wherein both data lines of each of the plurality of wired-OR differential pairs are active at a same time, whereby, when the state is detected wherein both data lines of a given differential pair are active at the same time, at least one bad memory cell exists within at least one of the predetermined number of enabled memory blocks.

15. The parallel testing method of claim 14, wherein a test mode signal is asserted prior to the enabling step, the test mode signal causing a block address decoder to simultaneously select the predetermined number of memory blocks.

16. The parallel testing method of claim 14, wherein the detecting step further includes a step of tri-stating an output of an output buffer connected to the given differential data line pair.

17. The parallel testing mode of claim 14, wherein the enabling step further includes a step of selecting memory blocks that are physically non-contiguous.

18. The parallel testing mode of claim 14, wherein each I/O pin of the device is coupled to a number of wired-OR differential pairs equal to the predetermined number of enabled memory blocks and wherein the reading step is carried out by simultaneously reading as many bits from each I/O pin of the device as the predetermined number of enabled memory blocks.

* * * * *